(12) United States Patent
Kawasaki et al.

(10) Patent No.: US 7,456,039 B1
(45) Date of Patent: Nov. 25, 2008

(54) METHOD FOR MANUFACTURING SEMICONDUCTOR OPTICAL DEVICE

(75) Inventors: Kazushige Kawasaki, Tokyo (JP); Takafumi Oka, Tokyo (JP); Katsuomi Shiozawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/946,917

(22) Filed: Nov. 29, 2007

(30) Foreign Application Priority Data

Jun. 14, 2007 (JP) .............................. 2007-157942

(51) Int. Cl.
*H01L 21/00* (2006.01)

(52) U.S. Cl. ........................ 438/31; 257/98; 385/129; 385/130; 385/131; 385/132; 372/7

(58) Field of Classification Search .................... 438/31; 257/98; 385/129–132, 147
See application file for complete search history.

(56) References Cited

U.S. PATENT DOCUMENTS 6,171,876 B1   1/2001   Yuang et al.
6,335,215 B1 *   1/2002   Yuang .......................... 438/31
7,177,336 B2   2/2007   Taneya et al.
2008/0090315 A1 *   4/2008   Abe et al. ...................... 438/31

FOREIGN PATENT DOCUMENTS

| JP | 2000-022261 | 1/2000 |
| JP | 2000-340880 | 12/2000 |
| JP | 2002-237655 | 8/2002 |
| JP | 2003-142769 | 5/2003 |
| JP | 2003-243775 | 8/2003 |
| JP | 2004-119772 | 4/2004 |
| WO | WO 03/085790 | 10/2003 |

* cited by examiner

*Primary Examiner*—Thao X Le
*Assistant Examiner*—Eric W Jones
(74) *Attorney, Agent, or Firm*—Leydig, Voit & Mayer, Ltd.

(57) ABSTRACT

An $SiO_2$ film is formed on a semiconductor layer stack, the $SiO_2$ film having a thickness da and an etch rate Ra in buffered (BHF). A waveguide ridge with the $SiO_2$ film thereon is formed using a resist pattern 76. An SiN film is formed on top and both sides of the waveguide ridge, while leaving the resist pattern in place, the SiN film having a thickness db and an etch rate Rb in BHF, where $1<(db/Rb)/(da/Ra)$. Then the resist pattern and the overlying portion of the SiN film are removed by lift-off to form an opening in the SiN film. Wet etching for a predetermined period of time with BHF removes the $SiO_2$ film from the waveguide ridge, while leaving the SiN film in place.

3 Claims, 4 Drawing Sheets

METHOD FOR MANUFACTURING SEMICONDUCTOR OPTICAL DEVICE

BACKGROUND OF THE INVENTION

1. Field of the Invention

The present invention relates to a method for manufacturing a semiconductor optical device, and more particularly to a method for manufacturing a semiconductor optical device in which the waveguide ridge has an electrode on its top.

2. Description of the Related Art

In recent years, there has been a great need to enhance the recording density of optical discs. In response to this need, attempts have been made to enable semiconductor lasers capable of light emission in the blue to ultraviolet range to be used in practical applications. Further in this connection, intense R&D effort has been carried out to develop nitride semiconductor lasers formed of a Group III-V nitride compound semiconductor such as AlGaInN. These are blue-violet laser diodes (hereinafter referred to as "blue-violet LDs"), some of which have already been practically used.

Such blue-violet LDs are formed by growing a compound semiconductor in crystal form on a GaN substrate.

A representative compound semiconductor is the Group III-V compound semiconductor, in which Group III and V elements are combined together. Mixed crystal III-V compound semiconductors having different compositions can be formed by bonding pluralities of Group III atoms and Group V atoms in different manners. Examples of compound semiconductors used to form a blue-violet LD include GaN, GaPN, GaNAs, InGaN, and AlGaN.

In ridge waveguide LDs, an electrode layer is usually provided on top of the waveguide ridge. This electrode layer is connected to the contact layer (i.e., the top layer of the waveguide ridge) through an opening formed in the insulating film covering the top portion of the waveguide ridge. This insulating film with the above opening is formed by lift-off using the same resist mask that was used to form the waveguide ridge. However, since the surface of the resist mask in contact with the contact layer is concavely curved with respect to the surface of the contact layer, part of the material used to form the insulating film covering the waveguide ridge remains in this concave portion and hence partly covers the surface of the contact layer even after the lift-off process, resulting in a reduction in the contact area between the electrode layer and the contact layer. That is, the contact area is smaller than the top surface area of the contact layer.

In the case of a red LD, this reduction in the contact area between the electrode layer and the contact layer due to the lift-off process does not significantly increase the contact resistance and hence the operating voltage of the LD, since the material used to form the contact layer (e.g., GaAs, etc.) has a relatively low contact resistance.

In the case of a blue-violet LD, on the other hand, the material used to form the contact layer is GaN, etc. having a relatively high contact resistance. Therefore, a reduction in the contact area between the electrode and the contract layer results in an increase in the contact resistance between them, thereby increasing the operating voltage of the blue-violet LD.

There will now be described several known methods for manufacturing an LD in such way as to prevent a reduction in the contact area between the electrode and the contact layer.

A first method forms a nitride semiconductor laser device in the following manner. First, a p-type electrode layer of palladium/molybdenum/gold is formed on a p-type contact layer which is the top layer of the semiconductor layer stack formed on a wafer. A resist mask (not shown) having a stripe shape is then formed on the p-type electrode layer and used to form a ridge stripe by RIE (Reactive Ion Etching). More specifically, the p-type electrode is formed by etching using Ar gas, and then the p-type contact layer and the p-type cladding layer, or these layers and the p-guiding layer, are etched by a mixed gas composed of Ar, $Cl_2$, and $SiCl_4$ to form the ridge stripe. (The etching is stopped at a depth halfway through the p-type cladding layer or the p-guiding layer.) Next, an insulating film (of Zr oxide predominantly including $ZrO_2$) having a thickness of 0.5 μm is formed over the surface of the wafer with the ridge stripe still leaving the resist thereon. The resist is then removed to expose the top surface of the ridge stripe. Further, a p-type pad electrode of molybdenum and gold is formed to cover the p-type electrode and at least the portions of the insulating film on both sides of the p-type electrode. (See, e.g., Japanese Domestic Republication of International Patent Application No. WO 2003/085790, lines 42-50 on page 9, FIG. 1.)

A second known method is a self-aligning method for manufacturing a ridge waveguide semiconductor LD and includes the step of forming two different photoresist layers one on top of the other, as described below.

The lower photoresist layer is only sensitive to light of wavelengths shorter than 300 nm, while the upper photoresist layer is only sensitive to light of wavelengths longer than 300 nm. Specifically, this self-aligning method is applied to a laminated semiconductor structure that includes a second cladding waveguide layer and a capping layer formed on the second cladding waveguide layer. The method begins by removing portions of the capping layer and the second cladding waveguide layer to form a ridge structure and a double channel. A second insulating film is then formed on the surfaces of the ridge structure and the double channel. A first photoresist layer (the lower photoresist layer) is then formed on the second insulating film, and a second photoresist layer (the upper photoresist layer) is formed on the first photoresist layer. Next, the second photoresist layer is patterned to expose the portions of the first photoresist layer around the ridge structure. Further, the first photoresist layer is processed by an RIE process to expose the portion of the second insulating film on the ridge structure. The portions of the second insulating film around the ridge structure are then removed by an etching process including an RIE process. The remaining portions of the first and second photoresist layers are then removed, and a first metal layer is deposited as an electrode. (See, e.g., JP-A-2000-22261, paragraphs 0024 to 0034, FIGS. 7 to 18.)

A third known method first forms a ridge and channels by wet etching the contact layer using a metal mask of Al and then wet etching the underlying layer using as a mask this contact layer with the metal mask still thereon. Next, an insulating film is formed over the entire surface of the substrate by plasma CVD, and the Al pattern (the metal mask) and the overlying portions of the insulating film are removed by lift-off. A resist pattern is then formed by a common lithographic process. (This resist pattern exposes the portion of the surface where a p-type electrode is subsequently formed.) A layer of electrode material is then formed by vacuum deposition using the resist pattern as a mask, and subsequently the resist pattern and the overlying portion of the electrode material layer are removed by lift-off to form the electrode in close contact with the contact layer of the ridge. (See, e.g., JP-A-2000-340880, paragraphs 0025 to 0034, FIG. 1.)

A fourth known method proceeds as follows. A first protective film is formed over substantially the entire surface of the p-side contact layer, and a third protective film having a stripe shape is formed on the first protective film. Then, after etching the first protective film with the third protective film thereon, the third protective film is removed. Then, the first protective film having a stripe shape is formed. The p-side contact layer is then etched through its entire thickness and the underlying layer (for example, a p-side cladding layer) is etched halfway through its thickness to form a waveguide having a stripe shape. Next, a second protective film (which has electrically insulating properties and is made of a different material than the first protective film) is formed on the sides of the stripe-shaped waveguide and on the top surface of the nitride semiconductor layer (i.e., the p-side cladding layer) exposed by the above etching process. The first protective film is then removed by lift-off, and a p-electrode is formed on the second protective film and the p-side contact layer such that the p-electrode is electrically connected to the p-side contact layer. (See, e.g., JP-A-2003-142769, paragraphs 0020 to 0027, FIG. 1.)

Further, a known process for forming a waveguide ridge proceeds as follows.

First, a first protective film made up of an Si oxide film or a resist is formed over substantially the entire surface of the p-type contact layer, and a third protective film having a stripe shape is formed on the first protective film. The first protective film with the third protective film thereon is then etched into a stripe shape. Next, the portions of the p-type contact layer not underlying the first insulating film are etched (without etching the first protective film) to form a stripe-shaped waveguide region under the first protective film. (Naturally, this waveguide region has a shape corresponding to the shape of the first protective film.) Then, after forming a rich layer, a second protective film (which has electrically insulating properties and which is made of a different material than the first protective film) is formed on the sides of the stripe-shaped waveguide, on the etched and exposed top surface of the nitride semiconductor layer (i.e., the p-side cladding layer), and on the first protective film. The first protective film and the overlying portion of the second protective film are then removed by etching, leaving the second protective film on the sides of the stripe (or waveguide) and on the top surface of the p-side cladding layer. (The remaining portion of the second protective film continuously extends from the sides of the stripe to the top surface of the p-side cladding layer.) The second protective film can be made of any material that is different from the material of the first protective film, that has high etch resistance or a lower etch rate than the first protective film in the above etching process for removing the first protective film, and that allows formation of the second protective film on the sides of the stripe, etc. (See, e.g., JP-A-2003-243775, paragraphs 0025 to 0034, FIG. 5.)

Another known process for forming a waveguide ridge proceeds as follows.

First, a GaN-based semiconductor layer is formed on a sapphire substrate, and an $SiO_2$ film (a first oxide film) is formed on the GaN-based semiconductor layer. A first $ZrO_2$ film (a second oxide film) is then formed on the $SiO_2$ film, and the substrate is heat-treated in an oxygen atmosphere so that the first $ZrO_2$ film becomes etch resistant to ammonium fluoride.

Next, a resist pattern is formed on the first $ZrO_2$ film, and the first $ZrO_2$ film is etched by RIE to transfer the pattern to the first $ZrO_2$ film. Subsequently, the $SiO_2$ film is etched, and then the resist pattern is removed to form a two-layer mask pattern made up of the first $ZrO_2$ film and the $SiO_2$ film.

The GaN-based semiconductor layer is then etched by dry etching using this mask pattern to form a convex (or ridge) portion. The sample (or substrate) is then immersed in an ammonium fluoride solution to etch away material from the sidewalls of the $SiO_2$ film to form a recess in these sidewalls.

Next, a second $ZrO_2$ film (a third oxide film) is deposited onto the first $ZrO_2$ film (the second oxide film) and onto the surfaces of the GaN-based semiconductor layer on both sides of its convex portion.

The sample (or substrate) is then immersed in an ammonium fluoride solution. The ammonium fluoride solution goes through the above recess to the sidewalls of the $SiO_2$ film (the first oxide film) and eventually etches away the entire $SiO_2$ film. As a result, the first $ZrO_2$ film (the second oxide film) and the overlying portion of the second $ZrO_2$ film (the third oxide film) are also removed, thus leaving the second $ZrO_2$ film only on both sides of the convex portion of the GaN-based semiconductor layer. (See, e.g., JP-A-2004-119772, paragraphs 0049 to 0057, FIGS. 1 and 2.)

Further, still another known process for forming a waveguide ridge includes the following step. The p-type contact layer is exposed by removing the overlying first and second protective films made of $SiO_2$ and $SiN_x$, respectively, (The first protective film is formed on the ridge stripe and forms a lower layer, and the second protective film is formed on the first protective film and forms an upper layer.) The etch rate of $SiN_x$ by hydrofluoric acid is disclosed to be lower than that of $SiO_2$. (See, e.g., JP-A-2002-237655, paragraph 0052.)

The above conventional methods for manufacturing an LD provide a sufficient contact area between the contact layer of the waveguide ridge and the electrode layer. However, these methods are disadvantageous in that it is difficult to reliably manufacture devices having substantially equal characteristics, since they include the step of: etching a metal film and the underlying semiconductor layer at the same time; etching the lower of two laminated resist layers to a predetermined controlled depth; or forming an electrode by lift-off after forming a metal film mask or a plurality of protective films. Further, employing a plurality of resists or protective films results in reduced freedom in process design.

SUMMARY OF THE INVENTION

The present invention has been devised to solve the above problems. It is, therefore, a primary object of the present invention to provide a method for manufacturing a semiconductor optical device with a high yield and in such a way as to reliably prevent a reduction in the contact area between the top semiconductor layer (or contact layer) of the waveguide ridge and the overlying electrode layer by employing a simple process.

According to one aspect of the present invention, there is provided a method for manufacturing a semiconductor optical device, comprising: forming a dielectric film on a top surface of a laminated semiconductor structure including a first semiconductor layer of a first conductivity type, an active layer, and a second semiconductor layer of a second conductivity type, in sequence, on a substrate, the dielectric film having a thickness da and having an etch rate Ra in a predetermined etchant; forming, by photolithography, a first resist pattern of a resist film disposed on a top surface of the dielectric film, the first resist pattern having a stripe shape corresponding to a waveguide ridge; removing the dielectric film by etching using the first resist pattern as a mask to expose the second semiconductor layer; removing portions of the second semiconductor layer by dry etching using the first resist pattern as a mask to form the waveguide ridge, the removed portions extending from a top surface of the second semiconductor layer toward a bottom of the second semiconductor layer; forming a first insulating film on a top and both sides of the waveguide ridge while leaving the first resist pattern, the first insulating film having a thickness db and having an etch rate Rb in the predetermined etchant, where $1<(db/Rb)/(da/Ra)$; removing the first resist pattern and the overlying portion of the first insulating film on top of the waveguide ridge by wet etching; performing wet etching for a predetermined period of time in the predetermined etchant to remove the dielectric film on the top of the waveguide ridge to expose the second semiconductor layer while leaving the first insulating film on the both sides of the waveguide ridge; and forming an electrode layer on the surface of the second semiconductor layer in the waveguide ridge.

Accordingly, in the method for manufacturing semiconductor optical device according to the present invention, the dielectric film has a thickness da and an etch rate Ra in a predetermined etchant and the first insulating film has a thickness db and an etch rate Rb in the same etchant, where $1<(db/Rb)/(da/Ra)$. This enables the method to perform the following step: after forming an opening in the first insulating film by lift-off to expose the dielectric film on the top of the waveguide ridge, performing wet etching for a predetermined period of time in the above etchant in such a way as to remove the dielectric film on the top of the waveguide ridge and thereby expose the top surface of the second semiconductor layer while leaving the first insulating film on both sides of the waveguide ridge. This prevents a reduction in the contact area between the second semiconductor layer of the waveguide ridge and the overlying electrode layer.

Thus, by employing the above simple process, the method can reliably prevent a reduction in the contact area between the top semiconductor layer (or contact layer) of the waveguide ridge and the overlying electrode layer and thereby increase the yield of the semiconductor optical device.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

While a preferred embodiment of the present invention will be described with reference to a blue-violet LD (a type of semiconductor optical device), it is to be understood that the invention is not limited to blue-violet LDs. The present invention can be applied to any semiconductor optical device such as a red LD, with the same effect.

First Embodiment

Figure 1:
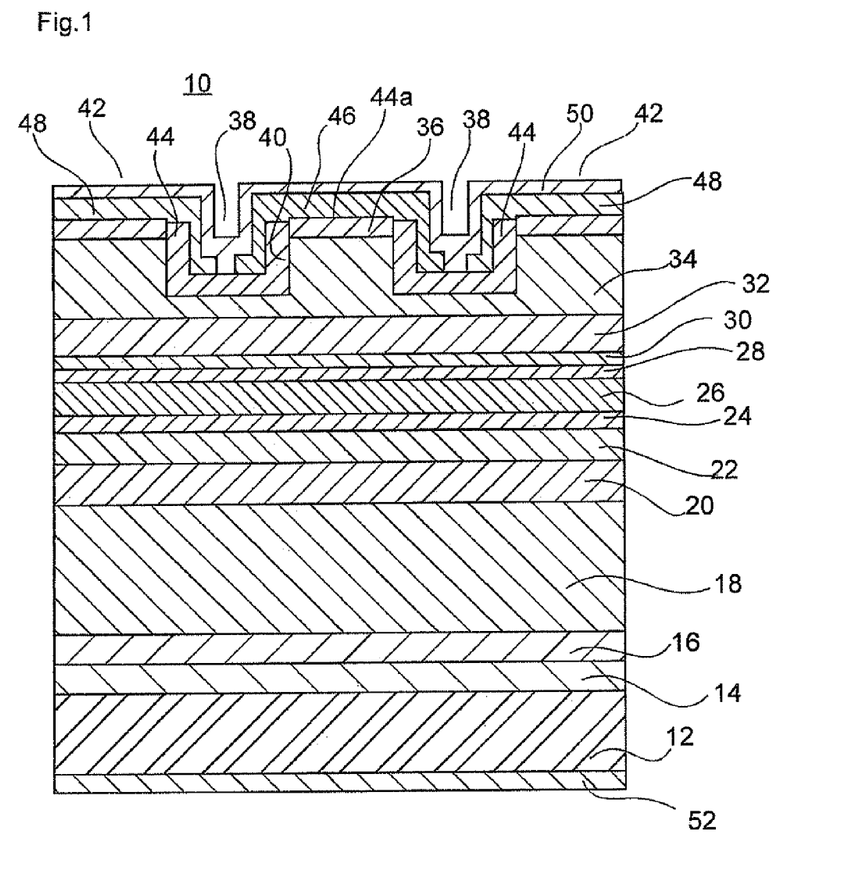
FIG. 1 is a cross-sectional view of an LD according to one embodiment of the present invention.

FIG. 1 is a cross-sectional view of an LD according to one embodiment of the present invention. It should be noted that in the figures, like numerals are used to denote like or corresponding components.

Referring to FIG. 1, the LD 10 is a ridge waveguide blue-violet LD in which the following layers are sequentially formed on top of one another on one principal surface (a Ga surface) of an n-type GaN substrate 12 (n-type, p-type, and i-type (undoped) being hereinafter abbreviated as "n-," "p-," and "i-," respectively): a buffer layer 14 of n-GaN; a first n-cladding layer 16 of n-AlGaN formed on the buffer layer 14; a second n-cladding layer 18 of n-AlGaN formed on the first n-cladding layer 16; a third n-cladding layer 20 of n-AlGaN formed on the second n-cladding layer 18; an n-side light guiding layer 22 of n-GaN formed on the third n-cladding layer 20; an n-side SCH (Separate Confinement Heterostructure) layer 24 of InGaN; and an active layer 26 on the n-side SCH layer 24. It should be noted that the first to third n-cladding layers 16, 18, 20 constitute a first semiconductor layer.

Further, the following layers are sequentially formed on top of one another on the active layer 26: a p-side SCH layer 28 of InGaN; an electron barrier layer 30 of p-AlGaN; a p-side light guiding layer 32 of p-GaN; a p-cladding layer 34 of p-AlGaN; and a contact layer 36 of p-GaN. According to the present embodiment, the p-cladding layer 34 and the contact layer 36 constitute a second semiconductor layer. In other embodiments, however, only one layer, or three or more layers, may constitute the second semiconductor layer.

Channels 38 serving as concave portions are formed in the contact layer 36 and the p-cladding layer 34. As a result, the contact layer 36 and the portion of the p-cladding layer 34 in contact with the contact layer 36 form a waveguide ridge 40.

The waveguide ridge 40 is located in a center portion of the width of the cleaved end faces (or resonator end faces) of the LD 10 and extends between the resonator end faces. The longitudinal dimension of the waveguide ridge 40, that is, the resonator length, is 1000 µm, and the ridge width perpendicular to the longitudinal direction is one micron to a few tens of microns. The present embodiment assumes this width to be 1.5 µm.

Further according to the present embodiment, the width of the channels is 10 µm. The raised platform portions on both sides of the waveguide ridge 40 with the channels 38 therebetween are referred to herein as the "electrode pad platforms 42."

The height of the waveguide ridge 40, that is, its height from the bottom surface of the channels 38, is, for example, 0.5 µm.

A silicon nitride film 44 serving as a first insulating film covers both sides of the channels 38 (i.e., the sidewalls of the waveguide ridge 40 and the sidewalls of the electrode pad platforms 42) and the bottom surfaces of the channels 38. The top edges of the silicon nitride film 44 that covers both sides of the channels 38 are slightly lower than the top surface of the contact layer 36.

The silicon nitride film 44 is made up of, for example, an SiN film having a thickness of 200 nm. The silicon nitride film 44 does not cover the top surface of the contact layer 36; it has an opening 44a that exposes the entire top surface of the contact layer 36 and upper portions of both sides of the contact layer 36.

A p-side electrode 46 is disposed on and electrically coupled to the top surface of the contact layer 36. The p-side electrode 46 is formed by sequentially depositing platinum (Pt) and Au by vacuum deposition. It closely covers the top surface of the contact layer 36, the upper portions of both sides of the contact layer 36, and the top edges of the silicon nitride film 44, and also covers the silicon nitride film 44 on the sidewalls of the waveguide ridge 40 and on portions of the bottom surfaces of the channels 38.

Further, a silicon oxide film 48 formed, for example, of $SiO_2$ covers the top surfaces of the electrode pad platforms 42 and also covers the silicon nitride film 44 on the sides of the electrode pad platforms 42 (within channels 38) and on portions of the bottom surfaces of the channels 38.

A pad electrode 50 is disposed on and in close contact with the top surface of the p-side electrode 46. It extends to cover the p-side electrode 46, the silicon nitride film 44, and the silicon oxide film 48 within both channels 38 and also cover the silicon oxide film 48 on the top surfaces of the electrode pad platforms 42.

It should be noted that the n-GaN substrate 12 has been reduced in thickness by polishing. Further, an n-side electrode 52 is disposed on the bottom surface of the n-GaN substrate 12. The n-side electrode 52 is formed by sequentially depositing Ti and Au films by vacuum deposition.

This LD 10 is doped with silicon (Si) and magnesium (Mg), which act as n-type and p-type impurities, respectively.

The n-GaN substrate 12 has a thickness of approximately 100 μm, and the buffer layer 14 has a thickness of approximately 1 μm. The first n-cladding layer 16 has a thickness of approximately 400 nm and is formed, for example, of n-$Al_{0.07}Ga_{0.93}N$. The second n-cladding layer 18 has a thickness of approximately 1000 nm and is formed, for example, of n-$Al_{0.045}Ga_{0.955}N$. The third n-cladding layer 20 has a thickness of approximately 300 nm and is formed, for example, of n-$Al_{0.015}Ga_{0.985}N$.

The n-side light guiding layer 22 has a thickness of, for example, 80 nm. The n-side SCH layer 24 has a thickness of 30 nm and is formed of i-$In_{0.02}Ga_{0.98}N$.

The active layer 26 has a double quantum well structure made up of a well layer 26a (not shown) of i-$In_{0.12}Ga_{0.88}N$ having a thickness of 5 nm, a barrier layer 26b (not shown) of i-$In_{0.02}Ga_{0.98}N$ having a thickness of $ nm, and a well layer 26c (not shown) of i-$In_{0.12}Ga_{0.88}N$ having a thickness of 5 nm. The well layer 26a is disposed on and in contact with the n-side SCH layer 24, the barrier layer 26b is disposed on the well layer 26a, and the well layer 26c is disposed on the barrier layer 26b.

The p-side SCH layer 28 disposed on and in contact with the well layer 26c of the active layer 26 has a thickness of 30 nm and is formed of i-$In_{0.02}Ga_{0.98}N$.

The electron barrier layer 30 has a thickness of approximately 20 nm and is formed of p-$Al_{0.2}Ga_{0.8}N$. The p-side light guiding layer 32 has a thickness of 100 nm, and the p-cladding layer 34 has a thickness of approximately 500 nm and is formed of p-$Al_{0.07}Ga_{0.93}N$. The contact layer 36 has a thickness of 20 nm.

There will now be described a method for manufacturing the LD 10.

FIGS. 2 to 11 are partial cross-sectional views illustrating process steps in a method for manufacturing an LD according to the present invention.

It should be noted that FIGS. 2 to 14 do not show the electron barrier layer 30 and the underlying layers including the n-GaN substrate 12, since these layers do not change in any way in the process steps described below after they are formed. These figures only show a cross section of a portion of the p-side light guiding layer 32 and a cross section of each overlying layer.

Figure 2:
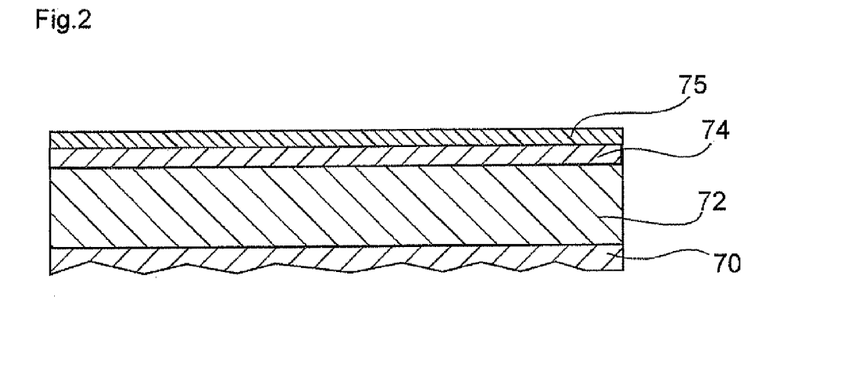
FIGS. 2 to 11 are partial cross-sectional views illustrating process steps in a method for manufacturing an LD according to the present invention.

The manufacturing method begins by providing a GaN substrate 12 whose surfaces have been cleaned by thermal cleaning, etc. An n-GaN layer (which is or will become the buffer layer 14) is then formed on the GaN substrate 12 by metalorganic chemical vapor deposition (MOCVD) at a growth temperature of, e.g., 1000° C.

Next, the following layers are sequentially formed on top of one another: an n-$Al_{0.07}Ga_{0.93}N$ layer (which is or will become the first n-cladding layer 16); an n-$Al_{0.045}Ga_{0.955}N$ layer (the second n-cladding layer 18); an n-$Al_{0.015}Ga_{0.985}N$ layer (the third n-cladding layer 20); an i-$In_{0.02}Ga_{0.98}N$ layer (the n-side light guiding layer 22); and an i-$In_{0.02}Ga_{0.98}N$ layer (the n-side SCH layer 24). Further, an i-$In_{0.12}Ga_{0.88}N$ layer (which is or will become the well layer 26a), an i-$In_{0.02}Ga_{0.98}N$ layer (the barrier layer 26b), and an i-$In_{0.12}Ga_{0.88}N$ layer (the well layer 26c) are sequentially formed on top of one another on the n-side SCH layer 24. (The well layers 26a and 26c and the barrier layer 26b sandwiched therebetween form the active layer 26, as described above.)

Next, the following layers are sequentially formed on top of one another on the active layer 26: an i-$In_{0.02}Ga_{0.98}N$ layer (which is or will become the p-side SCH layer 28); a p-$Al_{0.2}Ga_{0.8}N$ layer (the electron barrier layer 30); a p-$Al_{0.2}Ga_{0.8}N$ layer 70 (the p-side light guiding layer 32); a p-$Al_{0.07}Ga_{0.93}N$ layer 72 (the p-cladding layer 34); and a p-GaN layer 74 (the contact layer 36). Further, an $SiO_2$ film 75 serving as a dielectric film is deposited over the entire surface of the wafer by EB deposition after the crystal growth. That is, the $SiO_2$ film 75 is deposited onto the p-GaN layer 74 by EB deposition. Since film formation by deposition does not cause significant damage to the underlying layer, the $SiO_2$ film 75 can be formed without any significant damage to the p-GaN layer 74 in the above process.

It should be noted that instead of the $SiO_2$ film 75, one of the following films may be deposited: $Al_2O_3$, $Ta_2O_5$, $ZrO_2$, MgO, SiC, and $TiO_2$ films.

The minimum allowable value of the thickness da of the $SiO_2$ film 75 (deposited by EB deposition) is 20 nm to enable the film to reliably function as a protective film. On the other hand, its maximum allowable value is approximately 200 nm, since in the subsequent etching process the resist pattern formed on the $SiO_2$ film 75 may suffer a reduction in thickness. Preferably, the thickness da of the $SiO_2$ film 75 is 20 nm-50 nm. The present embodiment assumes it to be 40 nm.

Incidentally, the etch rate of an $SiO_2$ film by buffered hydrofluoric acid (hereinafter referred to as "BHF") varies depending on the method used to form the film. (BHF has an HF to ammonium fluoride ratio of 1:6.) Specifically, an $SiO_2$ film formed by ECR sputtering has an etch rate of 4.2 nm/sec; that formed by RF sputtering has an etch rate of 72 nm/sec; and that formed by EB deposition has an etch rate of 100 nm/sec or higher. Therefore, the etch rate Ra of the $SiO_2$ film 75 of the present embodiment in BHF is 100 nm/sec or higher.

It should be noted that the $SiO_2$ film 75 is preferably formed without any significant damage to the p-GaN layer 74, that is, without an increase in the resistance of the p-GaN layer 74. Further, the $SiO_2$ film 75 is preferably easy to remove later in the process to ensure high process stability and high yield. FIG. 2 shows the result of this process step.

Figure 3:
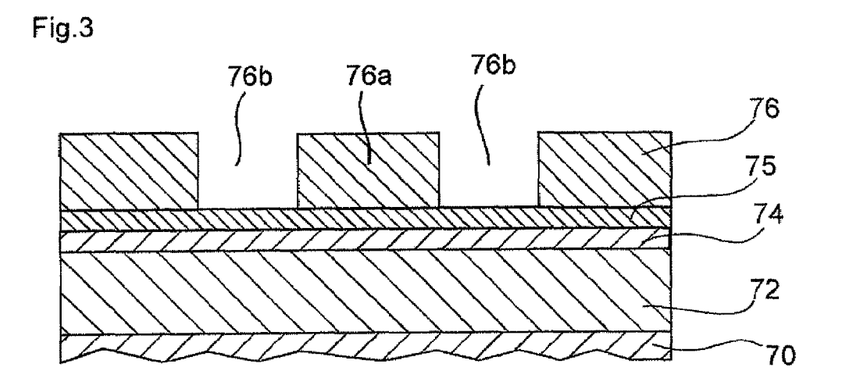

Referring now to FIG. 3, a resist is applied over the entire surface of the laminated semiconductor structure (whose top layer is the $SiO_2$ film 75), and this resist is patterned into a resist pattern 76 serving as a first resist pattern by a photolithography process. The resist pattern 76 includes a portion 76a remaining in correspondence to the shape of the waveguide ridge 40 (formed later in the process) and cutout portions 76b corresponding to the shapes of the channels 38, as shown in FIG. 3. According to the present embodiment, the portion 76a corresponding to the shape of the waveguide ridge 40 has a width of 1.5 μm, and the cutout portions 76b corresponding to the shapes of the channels 38 have a width of 10 μm.

Figure 4:
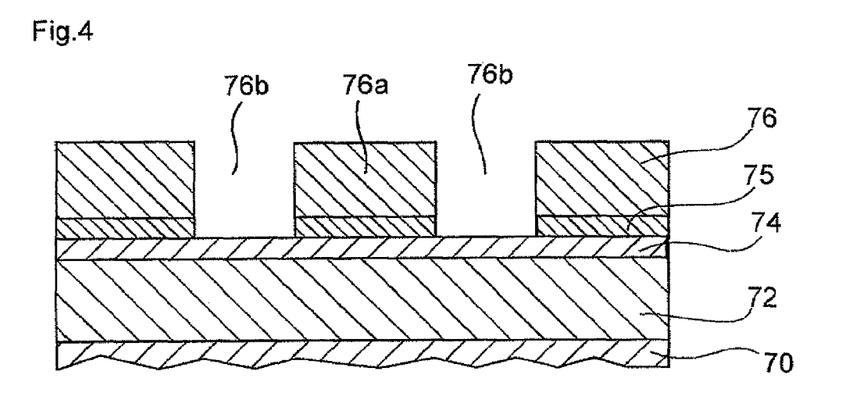

Referring now to FIG. 4, the SiO$_2$ film 75 is patterned into a stripe-shaped pattern by dry etching such as RIE (Reactive Ion Etching) or wet etching using the resist pattern 76 as a mask, leaving the SiO$_2$ film 75 on the region where the waveguide ridge 40 is subsequently formed, as shown in FIG. 4.

Figure 5:
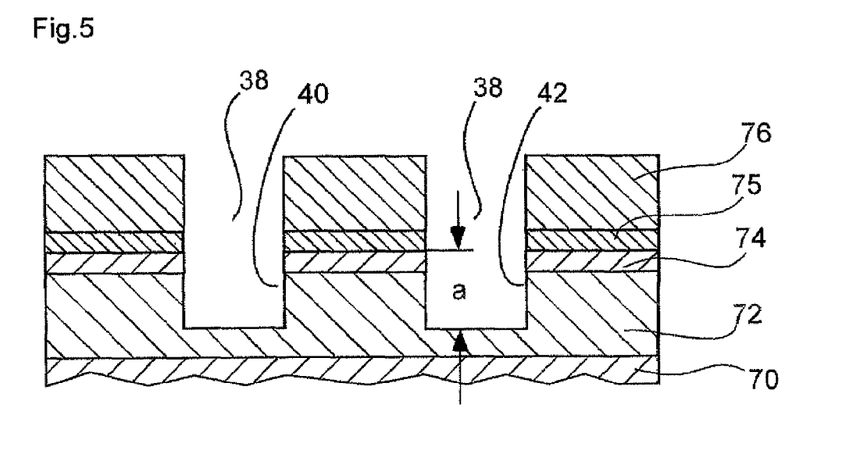

Referring now to FIG. 5, the p-GaN layer 74 is etched through its entire thickness and the p-Al$_{0.07}$Ga$_{0.93}$N layer 72 is etched to a predetermined depth by RIE using the resist pattern 76 as a mask to form the channels 38 whose bottoms are defined by the remaining portions of the p-Al$_{0.07}$Ga$_{0.93}$N layer 72.

According to the present embodiment, the entire etch depth a is approximately 500 nm, or 0.5 μm (see FIG. 5).

Forming the channels 38 results in the formation of the waveguide ridge 40 and the electrode pad platforms 42, as shown in FIG. 5.

Figure 6:
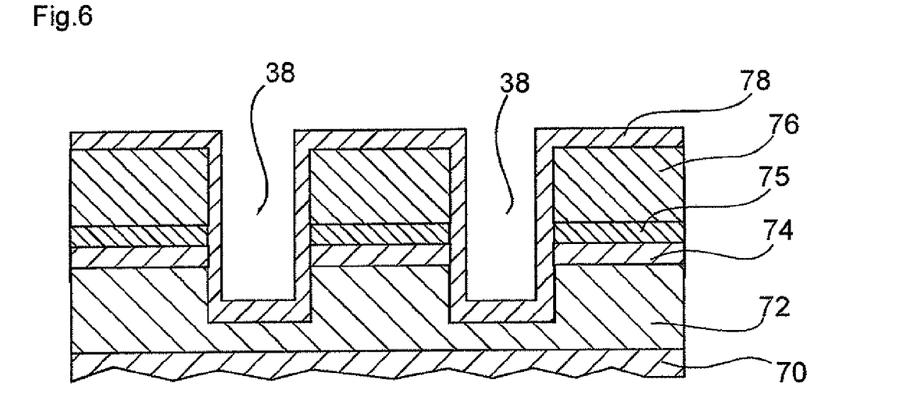

Referring now to FIG. 6, an SiN film 78 (which will become the silicon nitride film 44 serving as a first insulating film is formed over the entire surface of the wafer with the resist pattern 76 (which was used for etching in the previous process step) thereon by CVD, sputtering, etc. The SiN film 78 covers the top surface of the waveguide ridge 40, the inner surfaces of the channels 38, and the top surfaces of the electrode pad platforms 42, as shown in FIG. 6.

For example, the etch rate Rb of the SiN film 78 by BHF is 1.6 nm/sec if it is formed by CVD.

The SiN film 78 need have a thickness of 100 nm or more to meet the requirements of optical design. On the other hand, it is difficult or undesirable to form the SiN film 78 to a thickness of 400 nm or more since the height of the waveguide ridge is 500 nm and there are process variations. Therefore, the SiN film 78 has a thickness of approximately 100 nm-400 nm. For example, the present embodiment assumes the thickness db of the SiN film 78 to be 200 nm (or 0.2 μm).

It should be noted that since the SiN film 78 affects the optical characteristics of the LD, the film preferably exhibits as little change as possible in thickness when the SiO$_2$ film 75 is removed later in the process. FIG. 6 shows the results of this process step.

The thickness da of the SiO$_2$ film 75 formed at the previous process step and the thickness db of the SiN film 78 need satisfy the relation: (da/Ra)<(db/Rb), where Ra is the etch rate of the SiO$_2$ film 75 and Rb is the etch rate of the SiN film 78 by the etchant used. Further, they preferably satisfy the relation: 10*(da/Ra)<(db/Rb).

According to the present embodiment, the thickness da of the SiO$_2$ film 75 is 40 nm; the thickness db of the SiN film 78 is 200 nm; the etch rate Ra of the SiO$_2$ film 75 by BHF is 100 nm/sec; and the etch rate Rb of the SiN film 78 by BHF is 1.6 nm/sec. Therefore, (da/Ra) 0.4 sec; (db/Rb)=125 sec; and, hence, (da/Ra):(db/Rb)=1312.5. Thus, the relation 10*(da/Ra)<(db/Rb), not to mention the relation (da/Ra)<(db/Rb), is satisfied by a large margin.

It should be noted that instead of the SiN film 78, one of the following insulating films may be formed: SiON, TiO$_2$, Ta$_2$O$_5$, Al$_2$O$_3$, AlN, ZrO$_2$, Nb$_2$O$_5$, MgO, and SiC films.

Figure 7:
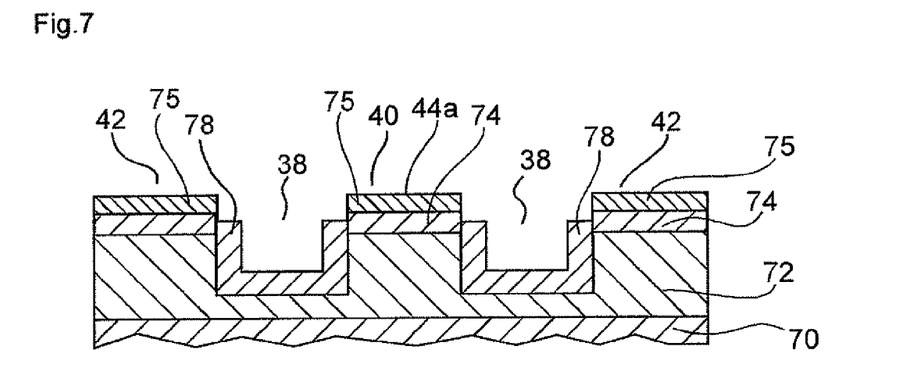

Referring now to FIG. 7, the resist pattern 76 and the overlying portions of the SiN film 78 are simultaneously removed by wet etching using an organic solvent. That is, these portions of the SiN film 78 are removed by lift-off.

More specifically, the portions of the SiN film 78 formed on the resist pattern 76 (and resist pattern 76) can be easily removed by ultrasonic cleaning using an organic solvent. As a result, the SiO$_2$ film 75 on the top of the waveguide ridge 40 is exposed. Both sides of the waveguide ridge 40, etc. are still covered with the SiN film 78. That is, the remaining portion of the SiN film 78 has an opening 44a that exposes the SiO$_2$ film 75 on top of the waveguide ridge 40, as shown in FIG. 7.

Figure 8:
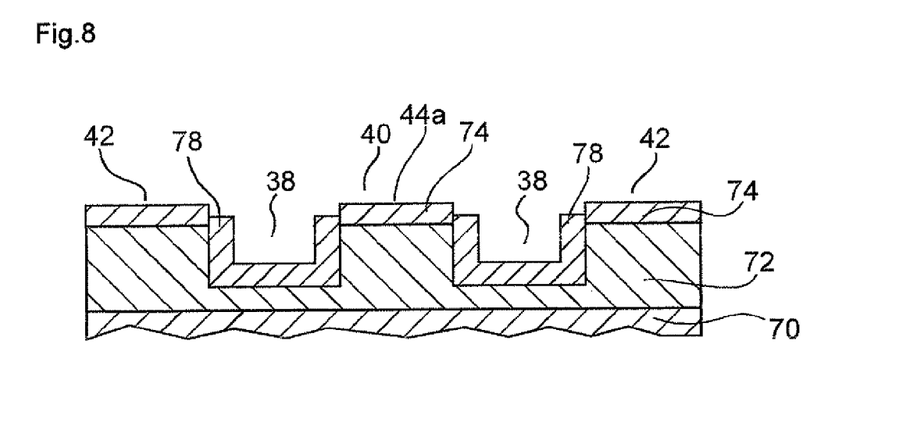

Referring now to FIG. 8, the wafer is wet etched by BHF for 30 sec. It should be noted that the quantity (da/Ra) for the SiO$_2$ film 75 is 0.4 sec, and the quantity (db/Rb) for the SiN film 78 is 125 sec. Therefore, this 30 sec etching completely removes the SiO$_2$ film 75 from on top of the waveguide ridge. As for the SiN film 78 on both sides of the waveguide ridge 40, etc., however, only a thickness of material slightly less than one quarter of the original thickness of the SiN film 78 (i.e., slightly less than 50 nm of material) is removed from the surface. That is, the SiN film 78 has a thickness of 150 nm or more even after the above etching, ensuring a sufficient process margin. FIG. 8 shows the results of this process step.

In this process, wet etching, not dry etching, is used to form the opening 44a in the SiN film 78 and remove the SiO$_2$ film 75. This avoids damage to the p-GaN layer 74, preventing an increase in the contact resistance between the p-GaN layer 74 (which will become the contact layer 36) and the overlying p-side electrode 46 (formed later in the process) and thereby increasing the yield of the LD 10.

Figure 9:
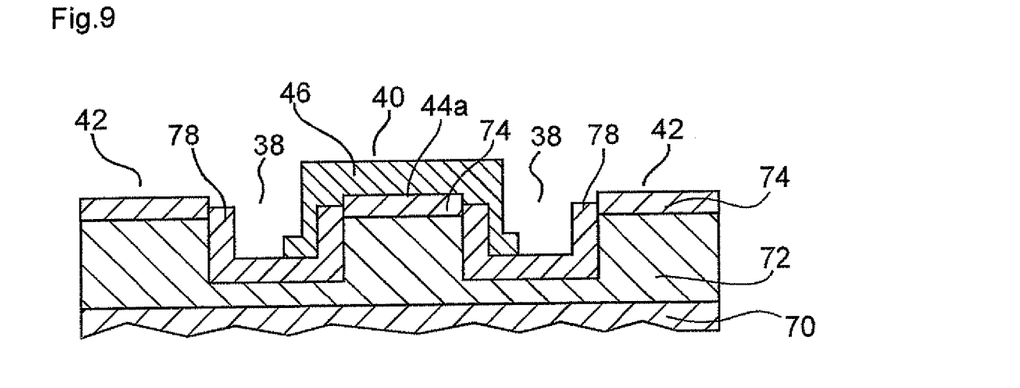

Referring now to FIG. 9, a p-side electrode 46 is formed on the top of the waveguide ridge 40.

More specifically, first, a resist is applied over the entire surface of the wafer and patterned by a photolithography process into a resist pattern (not shown) that exposes the top surface of the p-GaN layer 74 (i.e., the top layer of the waveguide ridge 40), the sidewalls of the waveguide ridge 40, and portions of the bottoms of the channels 38. An electrode layer made up of a laminated structure of Pt and Au is then formed over the resist pattern by, for example, vacuum deposition, and the resist film (or pattern) and the overlying portion of the electrode layer on the resist film are removed by lift-off to form the p-side electrode 46.

Thus, the top surface of the p-GaN layer 74 at the top of the waveguide ridge 40 and upper portions of both sides of the p-GaN layer 74 are not covered with the SiN film 78 and are entirely exposed through the opening 44a (at the time when the electrode layer is formed), preventing a reduction in the contact area and hence an increase in the contact resistance between the p-side electrode 46 and the p-GaN layer 74. FIG. 9 shows the results of this process step.

Figure 10:
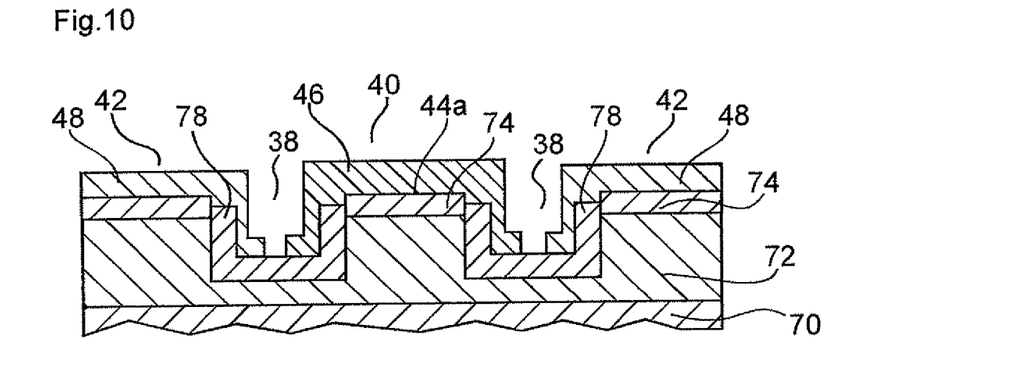

Next, a silicon oxide film 48 is formed.

Specifically, referring to FIG. 10, first a resist is applied over the entire surface of the wafer and patterned by a photolithography process into a resist pattern (not shown) that exposes the surface of the wafer except for the surface of the p-side electrode 46 (that is, exposes the top surfaces of the electrode pad platforms 42, the sides of the electrode pad platforms 42 within the channels 38, and portions of the bottoms of the channels 38). An SiO$_2$ film is then formed over the entire surface of the wafer by vapor deposition to a thickness of 100 nm, and the resist film (pattern) on the p-side electrode 46 and the portion of the SiO$_2$ film on the resist film are removed by lift-off to form a silicon oxide film 48 (made up of the remaining portions of the SiO$_2$ film). FIG. 10 shows the results of this process step.

It should be noted that instead of the SiO$_2$ film, one of the following insulating films may be formed: SiO$_x$ (0<x<2), SiN, SiON, TiO$_2$, Ta$_2$O$_5$, Al$_2$O$_3$, AlN, ZrO$_2$, and Nb$_2$O$_5$ films.

Figure 11:
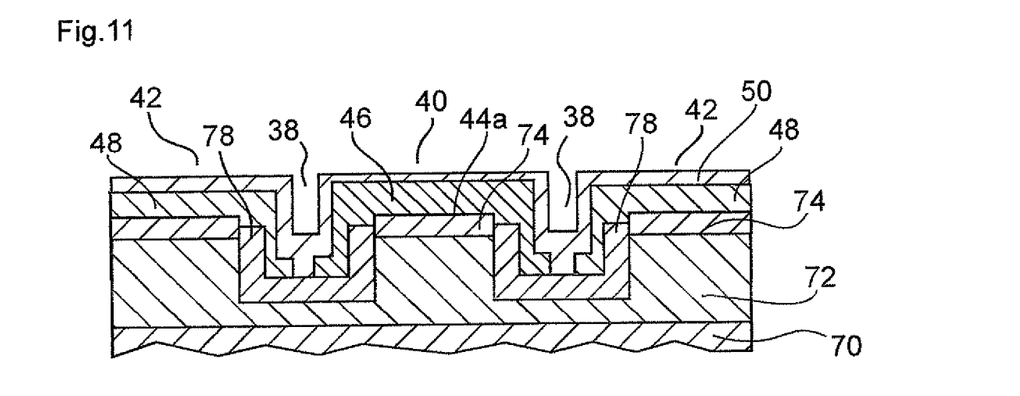

Lastly, referring now to FIG. 11, a metal film of Ti, Pt, and Au is formed over the p-side electrode 46, the channels 38, and the silicon oxide film 48 by vacuum deposition to form a pad electrode 50.

It should be noted that although in the above example the dielectric film (i.e., the SiO$_2$ film 75) and the first insulating film (i.e., the SiN film 78) are formed of different materials, they may be formed of the same material.

In such a case, since Ra=Rb, the dielectric film and the first insulating film are formed such that da<db, preferably such that 10*da<db to ensure sufficient process margin. For example, in the case of using BHF as the etchant, these films may be such that da=15 nm and db=200 nm.

The method of the present embodiment for manufacturing the LD 10 proceeds as follows. An SiO$_2$ film 75 having a thickness da and an etch rate Ra in BHF is formed on a wafer with a semiconductor layer stack thereon. A resist pattern 76 corresponding to the shape of a waveguide ridge 40 is then formed on the SiO$_2$ film 75, and the waveguide ridge 40 is formed by etching using the resist pattern 76 as a mask. An SiN film 78 having a thickness db and an etch rate Rb in BHF is then formed over the entire surface of the wafer with the resist pattern 76 thereon, where: (da/Ra)<(db/Rb).

Next, the resist pattern 76 and the overlying portions of the SiN film 78 on the resist pattern 76 are removed by wet etching to form an opening 44a in the SiN film 78 and thereby expose the SiO$_2$ film 75 on the top of the waveguide ridge 40.

The wafer is then wet etched by BHF for a predetermined period of time to completely remove the SiO$_2$ film 75 while leaving the SiN film 78 in place. A p-side electrode 46 is then formed over the top of the waveguide ridge 40.

In this LD manufacturing method, when the p-side electrode 46 is formed on and in contact with the top surface of a semiconductor layer (namely, the p-GaN layer 74, which will become the contact layer 36), the top surface is not covered with the SiO$_2$ film 75 and is entirely exposed through the opening 44a formed in the SiN film 78, thereby avoiding a reduction in the contact area between the p-side electrode 46 and the contact layer 36 to prevent an increase in the operating voltage. Further, the opening 44a is formed in the SiN film 78 by wet etching, not by dry etching, in order to avoid damage to the p-GaN layer 74 and thereby prevent an increase in the contact resistance between the p-GaN layer 74 (or contact layer 36) and the overlying p-side electrode 46 and prevent an increase in the operating voltage. As a result, it is possible to manufacture the LD 10 having good characteristics with a high yield by employing a simple process.

As described above, a method for manufacturing a semiconductor optical device according to the present invention, comprising: forming a dielectric film on a top surface of a laminated semiconductor structure including a first semiconductor layer of a first conductivity type, an active layer, and a second semiconductor layer of a second conductivity type, in sequence, on a substrate, the dielectric film having a thickness da and having an etch rate Ra in a predetermined etchant; forming, by photolithography, a first resist pattern of a resist film disposed on a top surface of the dielectric film, the first resist pattern having a stripe shape corresponding to a waveguide ridge; removing the dielectric film by etching using the first resist pattern as a mask to expose the second semiconductor layer; removing portions of the second semiconductor layer by dry etching using the first resist pattern as a mask to form the waveguide ridge, the removed portions extending from a top surface of the second semiconductor layer toward a bottom of the second semiconductor layer; forming a first insulating film on a top and both sides of the waveguide ridge while leaving the first resist pattern, the first insulating film having a thickness db and having an etch rate Rb in the predetermined etchant, where 1<(db/Rb)/(da/Ra); removing the first resist pattern and the overlying portion of the first insulating film on top of the waveguide ridge by wet etching; performing wet etching for a predetermined period of time in the predetermined etchant to remove the dielectric film on the top of the waveguide ridge to expose the second semiconductor layer while leaving the first insulating film on the both sides of the waveguide ridge; and forming an electrode layer on the surface of the second semiconductor layer in the waveguide ridge.

Accordingly, in the method for manufacturing semiconductor optical device according to the present invention, the dielectric film has a thickness da and an etch rate Ra in a predetermined etchant and the first insulating film has a thickness db and an etch rate Rb in the same etchant, where 1<(db/Rb)/(da/Ra). This enables the method to perform the following step: after forming an opening in the first insulating film by lift-off to expose the dielectric film on the top of the waveguide ridge, performing wet etching for a predetermined period of time in the above etchant in such a way as to remove the dielectric film on the top of the waveguide ridge and thereby expose the top surface of the second semiconductor layer while leaving the first insulating film on both sides of the waveguide ridge. This prevents a reduction in the contact area between the second semiconductor layer of the waveguide ridge and the overlying electrode layer.

Thus, by employing the above simple process, the method can reliably prevent a reduction in the contact area between the top semiconductor layer (or contact layer) of the waveguide ridge and the overlying electrode layer and thereby increase the yield of the semiconductor optical device.

Thus, the method for manufacturing semiconductor optical device according to the present invention is suitable for manufacturing a semiconductor optical device in which the waveguide ridge has an electrode on its top.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A method for manufacturing a semiconductor optical device, comprising:
   forming a dielectric film on a top surface of a laminated semiconductor structure including a first semiconductor layer of a first conductivity type, an active layer, and a second semiconductor layer of a second conductivity type, in sequence, on a substrate, the dielectric film having a thickness da and having an etch rate Ra in a predetermined etchant;
   forming, by photolithography, a first resist pattern of a resist film disposed on a top surface of the dielectric film, the first resist pattern having a stripe shape corresponding to a waveguide ridge;
   removing part of the dielectric film by etching, using the first resist pattern as a mask, to expose part of the second semiconductor layer;
   removing portions of the second semiconductor layer by dry etching, using the first resist pattern as a mask, to form the waveguide ridge, the portions of the second semiconductor layer removed formerly extending from a top surface of the second semiconductor layer toward a bottom of the second semiconductor layer;

forming a first insulating film on a top and both sides of the waveguide ridge while leaving the first resist pattern in place, the first insulating film having a thickness db and having an etch rate Rb in the predetermined etchant, where 1<(db/Rb)/(da/Ra);

removing the first resist pattern and the portion of the first insulating film on top of the waveguide ridge by wet etching;

wet etching for a predetermined period of time in the predetermined etchant to remove the dielectric film from the top of the waveguide ridge and to expose the second semiconductor layer, while leaving the first insulating film in place on both sides of the waveguide ridge; and forming an electrode layer on the second semiconductor layer in the waveguide ridge.

2. The method for manufacturing a semiconductor optical device according to claim 1, wherein the thickness da and the etch rate Ra of the dielectric film and the thickness db and the etch rate Rb of the first insulating film satisfy the relation: 10<(db/Rb)/(da/Ra).

3. The method for manufacturing a semiconductor optical device according to claim 1, wherein the second semiconductor layer includes Ga and N.

* * * * *